United States Patent
Kosenko et al.

(10) Patent No.: US 9,515,024 B2
(45) Date of Patent: Dec. 6, 2016

(54) STRUCTURES WITH THROUGH VIAS PASSING THROUGH A SUBSTRATE COMPRISING A PLANAR INSULATING LAYER BETWEEN SEMICONDUCTOR

(71) Applicant: Invensas Corporation, San Jose, CA (US)

(72) Inventors: Valentin Kosenko, Mountain View, CA (US); Sergey Savastiouk, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/824,520

(22) Filed: Aug. 12, 2015

(65) Prior Publication Data

US 2015/0348843 A1    Dec. 3, 2015

Related U.S. Application Data

(60) Division of application No. 14/456,726, filed on Aug. 11, 2014, now Pat. No. 9,142,511, which is a
(Continued)

(51) Int. Cl.
*H01L 21/4763*    (2006.01)
*H01L 23/538*    (2006.01)
(Continued)

(52) U.S. Cl.
CPC ....... *H01L 23/5384* (2013.01); *H01L 21/4857* (2013.01); *H01L 21/76898* (2013.01);
(Continued)

(58) Field of Classification Search
CPC .................................................... H05K 3/427
See application file for complete search history.

(56) References Cited

U.S. PATENT DOCUMENTS 3,761,782 A    9/1973    Yourmans
5,229,647 A    7/1993    Gnadinger
(Continued)

OTHER PUBLICATIONS

Thru-Silicon Vias, Current State of the Technology, Jan. 30, 2011, 4 pages.
(Continued)

*Primary Examiner* — Marvin Payen
*Assistant Examiner* — Andre' C Stevenson
(74) *Attorney, Agent, or Firm* — Haynes and Boone LLP

(57) ABSTRACT

A through via contains a conductor (244, 262) passing through a substrate (140). The substrate can be SOI or some other substrate containing two semiconductor layers (140.1, 140.2) on opposite sides of an insulating layer (140B). The through via includes two constituent vias (144.1, 144.2) formed from respective different sides of the substrate by processes stopping on the insulating layer (140B). Due to the insulating layer acting as a stop layer, high control over the constituent vias' depths is achieved. Each constituent via is shorter than the through via, so via formation is facilitated. The conductor is formed by separate depositions of conductive material into the constituent vias from each side of the substrate. From each side, the conductor is deposited to a shallower depth than the through-via depth, so the deposition is facilitated. Other embodiments are also provided.

14 Claims, 20 Drawing Sheets

Related U.S. Application Data continuation of application No. 13/852,322, filed on Mar. 28, 2013, now Pat. No. 8,829,683, which is a division of application No. 13/181,006, filed on Jul. 12, 2011, now Pat. No. 8,431,431.

(51) Int. Cl.
  *H01L 25/00* (2006.01)
  *H01L 23/48* (2006.01)
  *H01L 23/14* (2006.01)
  *H01L 23/498* (2006.01)
  *H01L 21/48* (2006.01)
  *H01L 21/768* (2006.01)

(52) U.S. Cl.
  CPC .......... *H01L 23/147* (2013.01); *H01L 23/481* (2013.01); *H01L 23/49822* (2013.01); *H01L 25/50* (2013.01); *H01L 21/486* (2013.01); *H01L 23/49827* (2013.01); *H01L 2224/16* (2013.01); *H01L 2225/06541* (2013.01); *H01L 2924/1461* (2013.01)

(56) References Cited

U.S. PATENT DOCUMENTS

| | | |
|---|---|---|
| 6,897,148 B2 | 5/2005 | Halahan et al. |
| 6,958,285 B2 | 10/2005 | Siniaguine |
| 7,173,327 B2 | 2/2007 | Siniaguine |
| 7,661,191 B2 | 2/2010 | Nakamura et al. |
| 2005/0027934 A1 | 2/2005 | Johnson |
| 2006/0027934 A1* | 2/2006 | Edelstein ............. H01L 21/486 257/774 |
| 2007/0281459 A1* | 12/2007 | Nakamura ............. H05K 3/4679 438/618 |
| 2008/0160757 A1 | 7/2008 | Hans et al. |
| 2008/0290524 A1 | 11/2008 | Lanzerotti et al. |
| 2010/0072627 A1 | 3/2010 | Wang |
| 2012/0228778 A1 | 9/2012 | Kosenko et al. |
| 2012/0267773 A1 | 10/2012 | Ebefors et al. |

OTHER PUBLICATIONS

Amini, B. Vakili et al. "Sub-Micro-Gravity Capacitive SOI Microaccelerometers," The 13$^{th}$ International Conference on Solid-State Sensors, Actuators and Microsystems, Seoul, Korea, Jun. 5-9, 2005, pp. 515-518.

Bellew, Colby L. et al. "An SOI Process for Fabrication of Solar Cells, Transistors and Electrostatic Actuators," The 12$^{th}$ International Conference on Solid State Sensors, Actuators and Microsystems, Boston, Jun. 8-12, 2003, pp. 1075-1079.

Bauer, Tomas "High Density Through Wafer Via Technology," Silex Microsystems, NSTI-Nanotech 2007, www.nsti.org, ISBN 1420061844 vol. 3, 2007, pp. 116-119.

Thevenoud, J-M et al. "DRIE Technology: From Micro to Nanoapplications," Alcatel Micro Machining Systems, ESIEE, no later than Jun. 12, 2011, pp. 1-8.

Non-Final Office Action in U.S. Appl. No. 13/042,186 issued Oct. 10, 2012, 11 pages total.

Final Office Action mailed Apr. 5, 2013 from related U.S. Appl. No. 13/042,186.

Kosenko et al., U.S. Appl. No. 13/042,186, filed Mar. 7, 2011, 34 pages.

\* cited by examiner

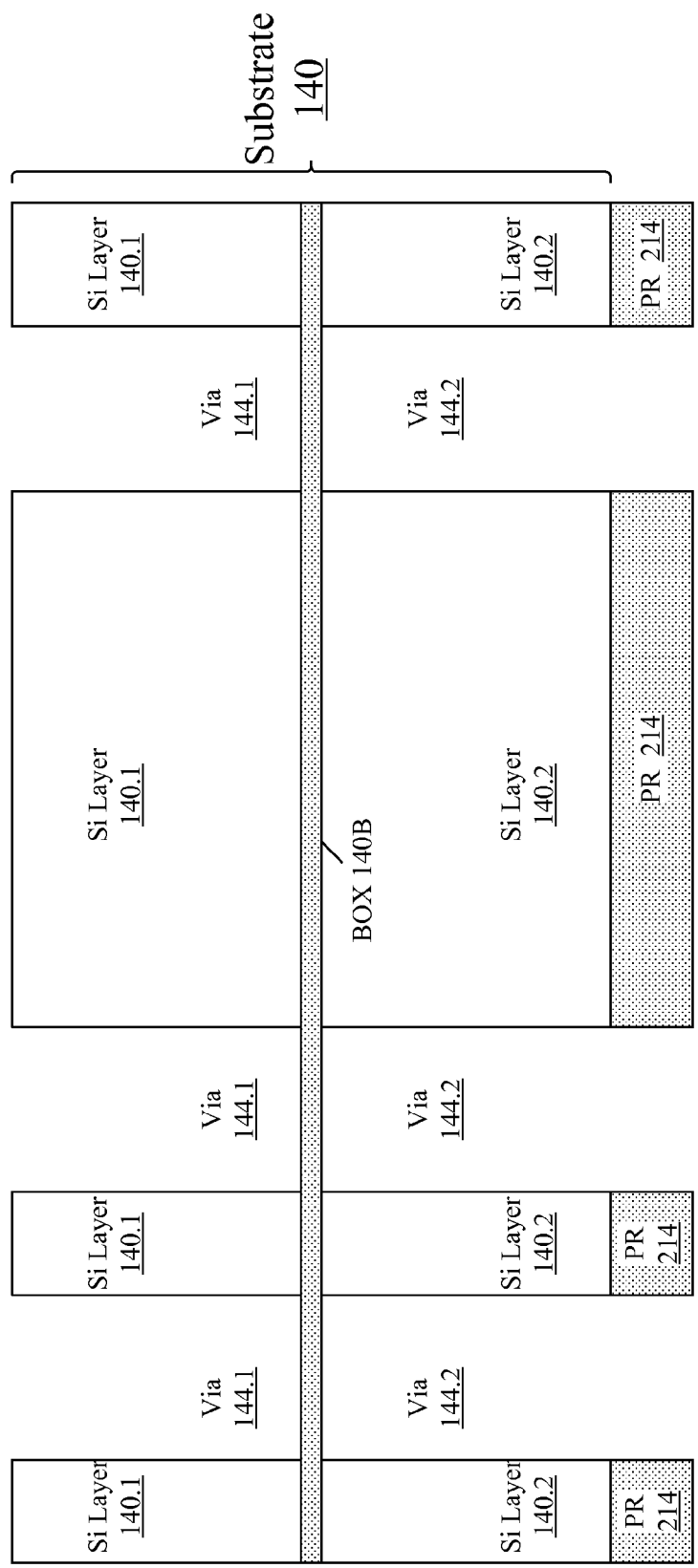

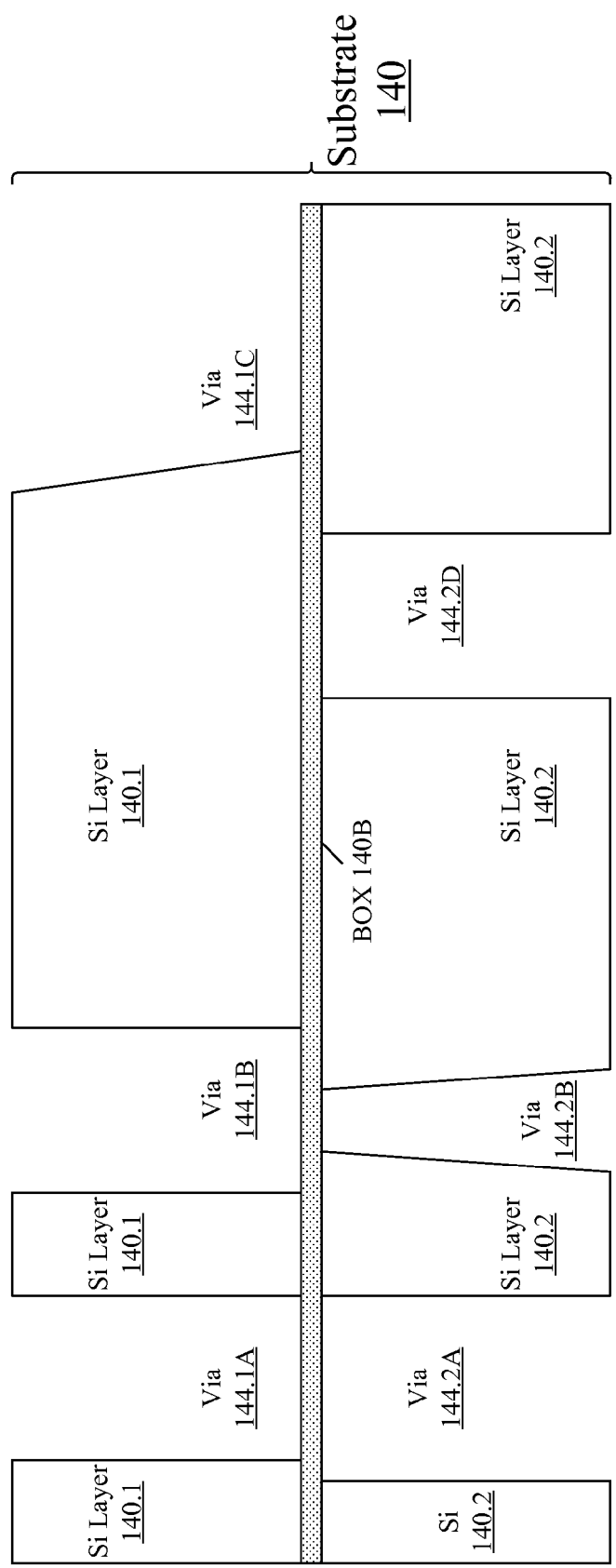

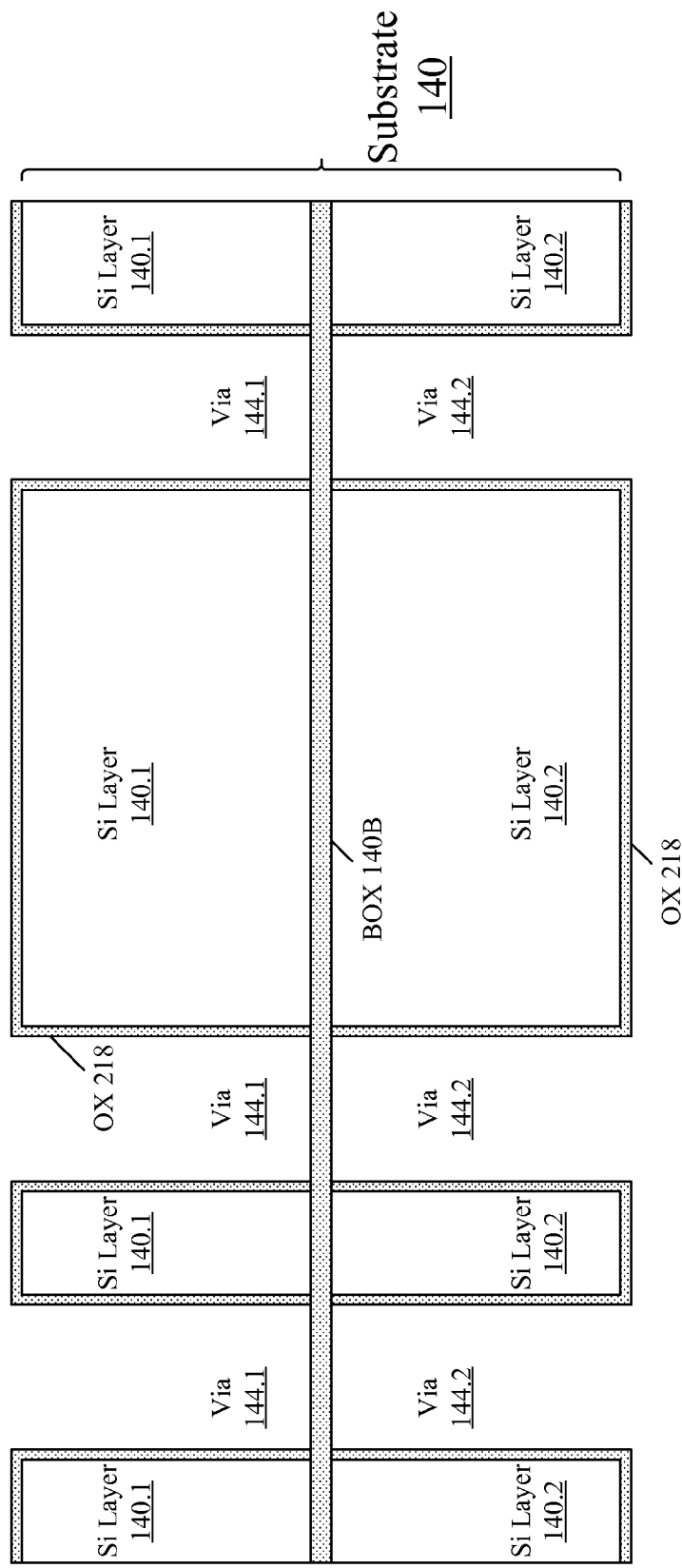

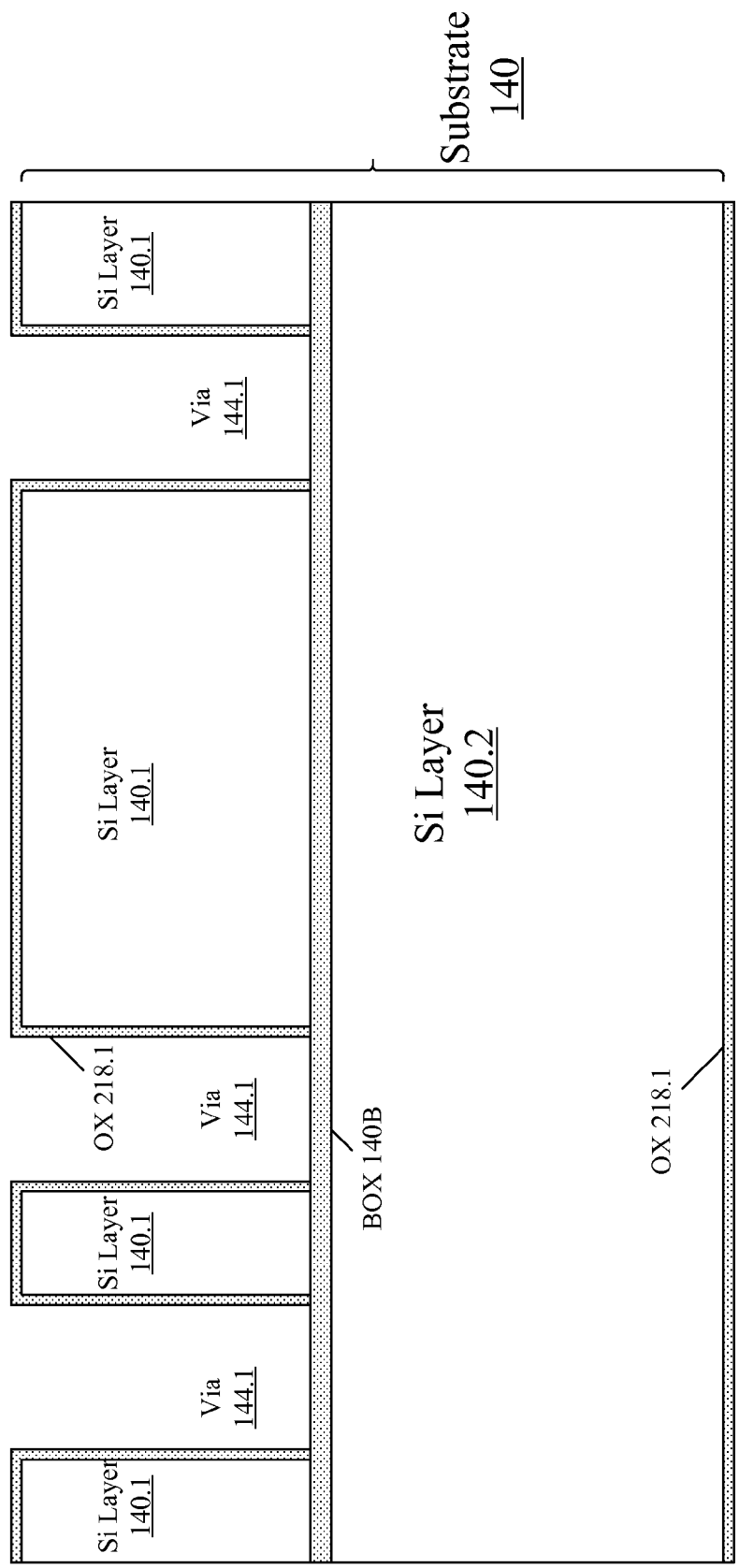

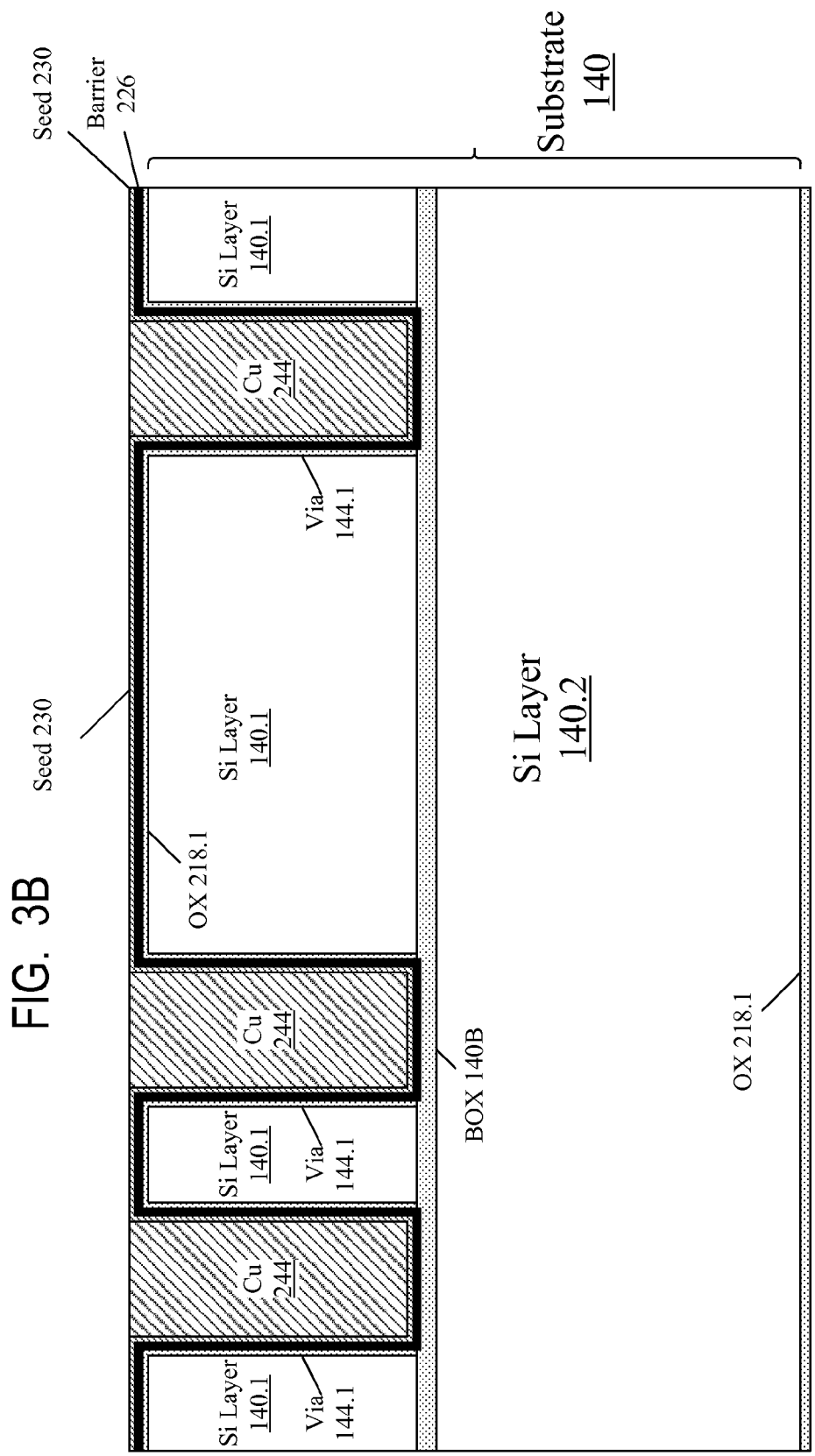

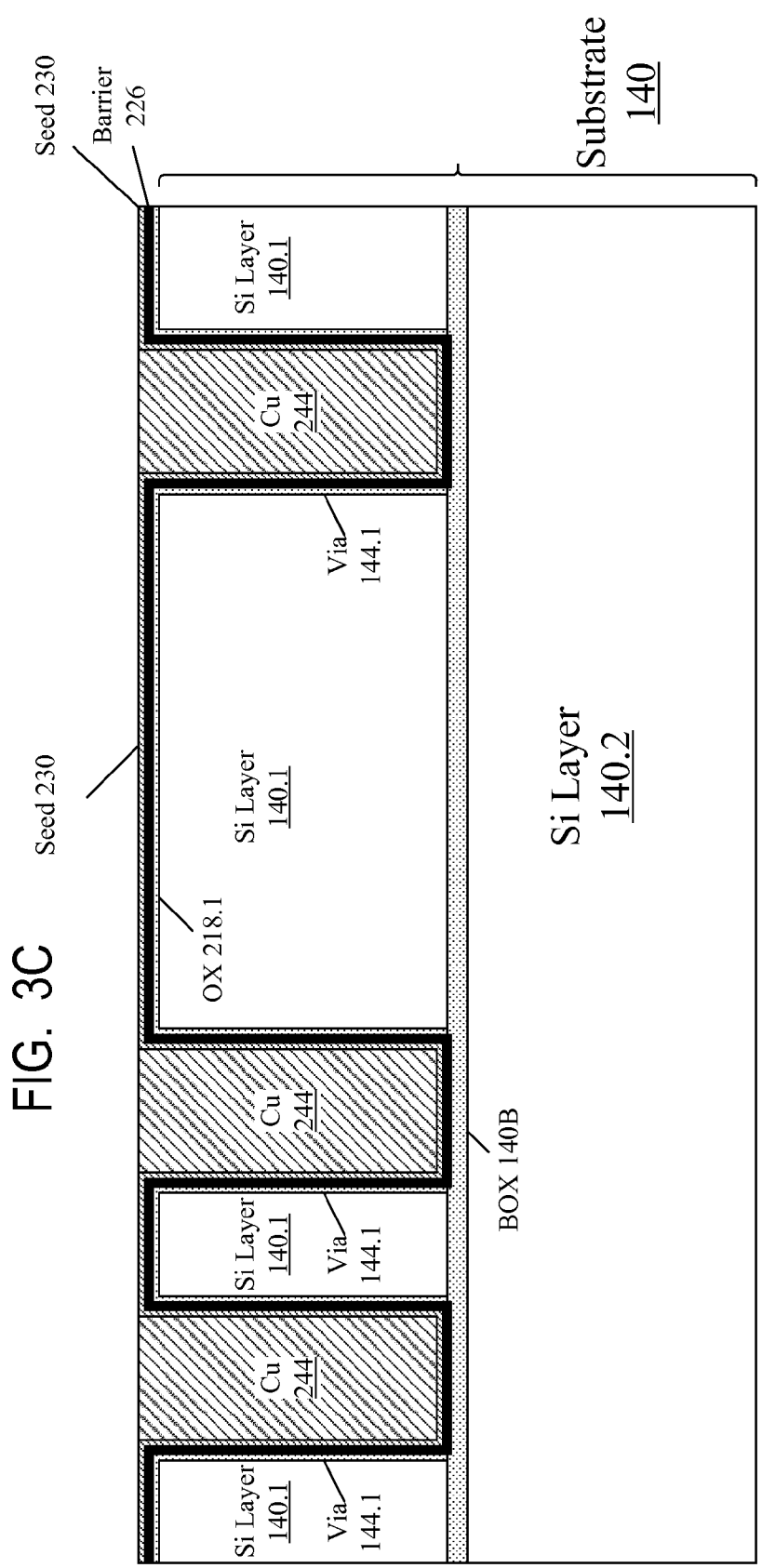

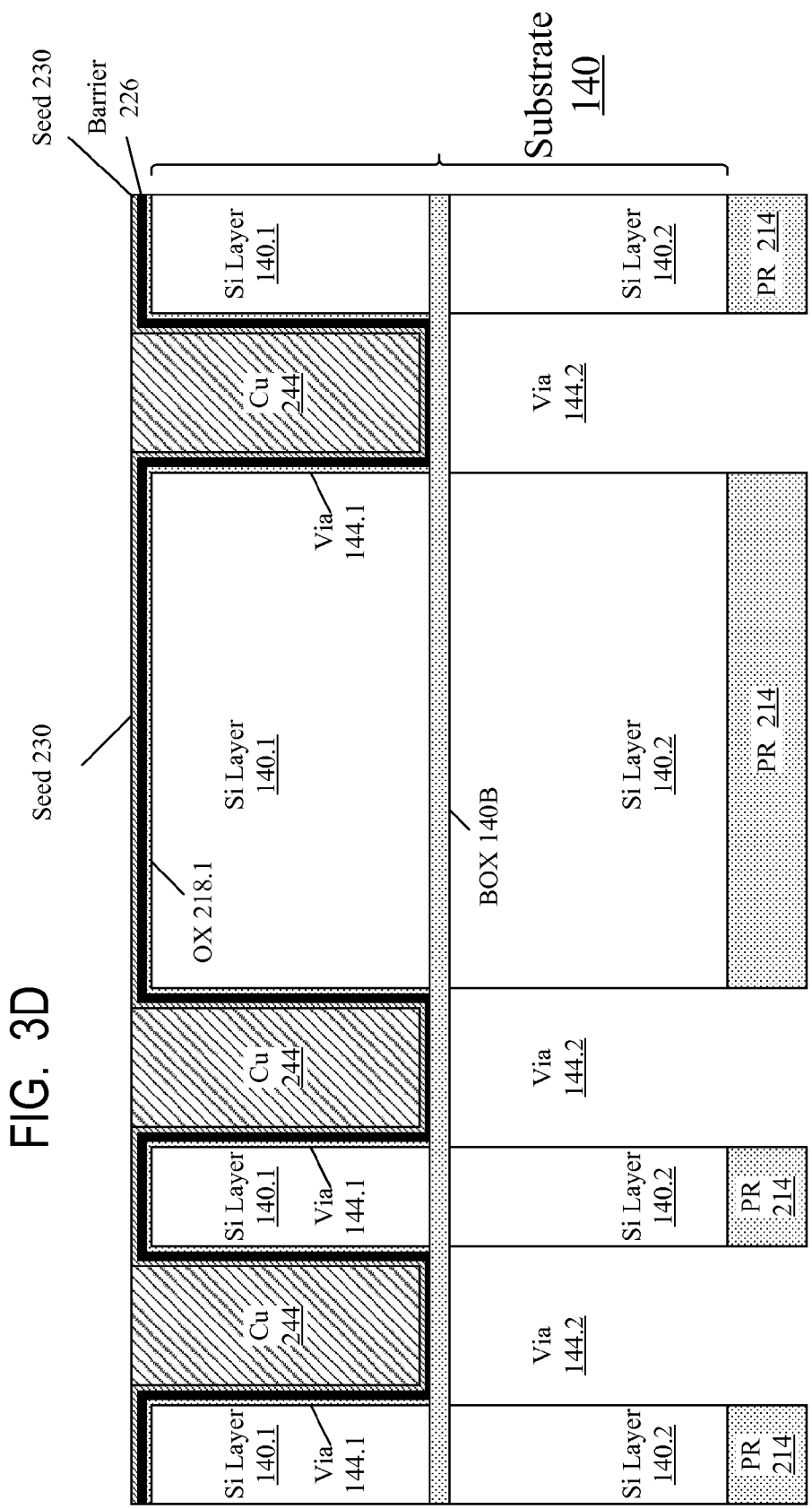

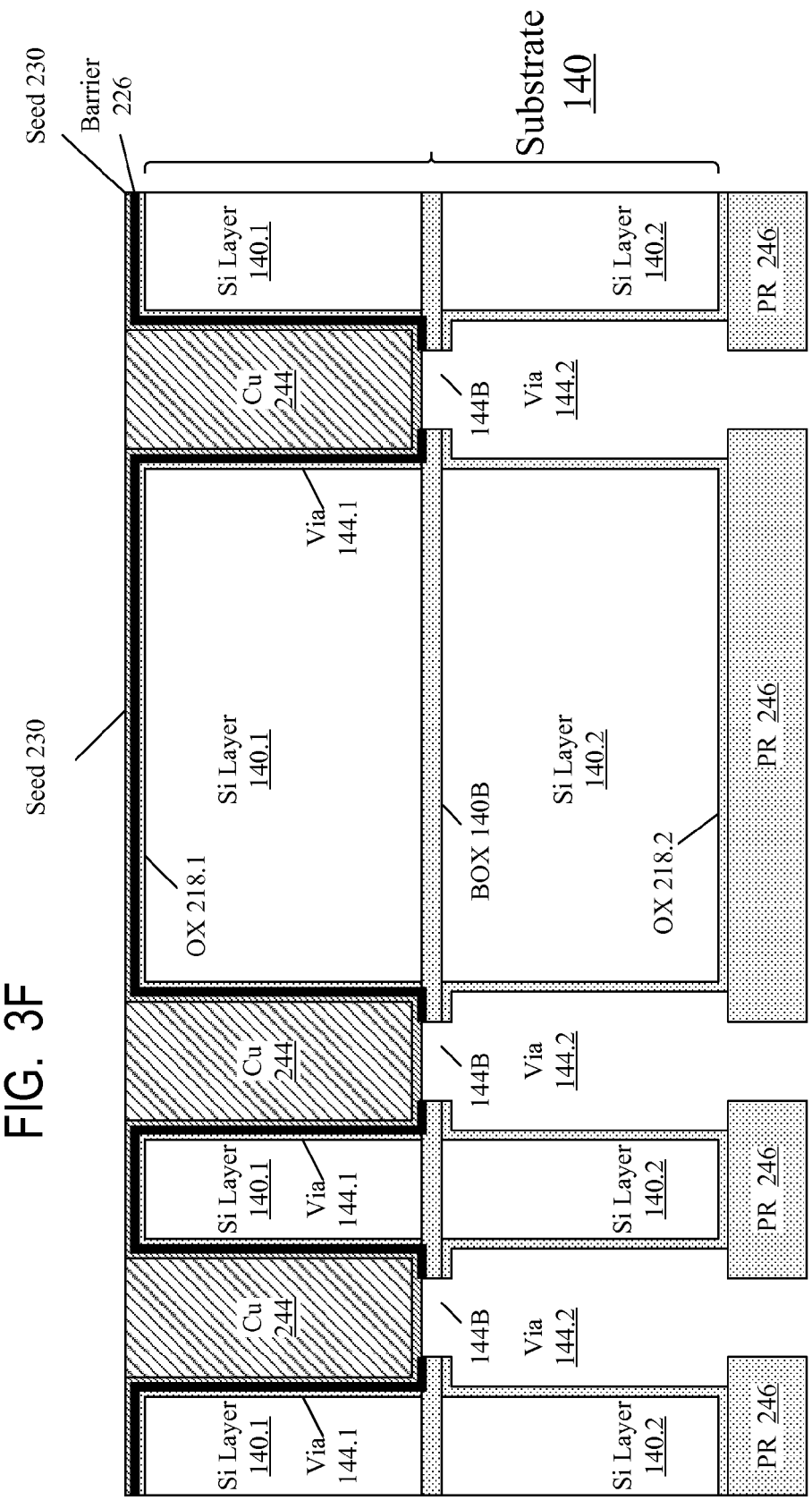

STRUCTURES WITH THROUGH VIAS PASSING THROUGH A SUBSTRATE COMPRISING A PLANAR INSULATING LAYER BETWEEN SEMICONDUCTOR

CROSS REFERENCE TO RELATED APPLICATION

This application is a division of U.S. patent application Ser. No. 14/456,726, filed Aug. 11, 2014, incorporated herein by reference, which is a continuation of U.S. patent application Ser. No. 13/852,322, filed on Mar. 28, 2013, incorporated herein by reference in its entirety, which is a divisional of U.S. patent application Ser. No. 13/181,006 filed Jul. 12, 2011 (now U.S. Pat. No. 8,431,431), which is hereby incorporated herein by reference in its entirety.

BACKGROUND OF THE INVENTION

The present invention relates to integrated circuits, and more particularly to substrates having through vias possibly containing conductive features.

Through vias with conductive features are used to shorten conductive paths between circuit elements in integrated-circuit packages. For example, FIG. 1 illustrates integrated circuit dies 110 attached to a printed circuit board (PCB) 120 through an interposer 130. The interposer includes a substrate 140 with metalized through vias 144. Compared to a direct attachment of dies 110 to PCB 120, the interposer can redistribute the contact pads to reduce the package area (the area of the entire structure). More particularly, dies 110 have contact pads 110C attached to the interposer's contact pads 130C.1 by solder features 150. The interposer has contact pads 130C.2 attached to contact pads 120C of PCB 120 with other solder features 150. Many fabrication processes allow smaller critical dimensions in dies 110 than in PCB 120. Therefore, the die contacts 110C can be smaller, and spaced closer to each other, than possible for PCB contacts 120C. Interposer 130 includes redistribution (rerouting) layers 154 with conductive lines 158 connecting the interposer contacts 110C.1 to the metal in vias 144. Lines 158 allow the PCB contacts to be redistributed. For example, if a die's contacts 110C are positioned on the die's periphery rather than being evenly distributed over the die's area, the corresponding PCB contacts 120C can be evenly distributed over an area equal to the die's area. Therefore, the spacing between the PCB contacts can be enlarged without increasing the area. Further, some contacts 110C on the same or different dies 110 may be designed for connection to the same input, e.g. the same signal or a power or ground voltage. Such contacts 110C may be connected to a single PCB contact 120C through lines 158, allowing the PCB contacts 120C to be fewer and occupy a smaller area. Thus, the area required for the die attachment is reduced.

Vias 144 should be narrow to reduce the package size. At the same time, the interposer's substrate 140 should be sufficiently thick to withstand the mechanical and electrical stresses and meet the heat distribution requirements during fabrication and operation. These two goals—narrow vias and a thick substrate—drive up the vias' aspect ratio. The high aspect ratio complicates both via formation and via filling with metal. In particular, it is difficult to provide reliable metallization, without voids or breaks, in high-aspect-ratio vias. Hence, the vias are widened to undesirably increase the package area.

SUMMARY

This section summarizes some features of the invention. Other features may be described in the subsequent sections. The invention is defined by the appended claims, which are incorporated into this section by reference.

In some embodiments, the vias 144 are formed from opposite sides of substrate 140. For example, the vias can be etched or drilled part way through the top of substrate 140 and part way through the bottom of substrate 140. Also, metal (or another conductive material) can be deposited into the vias part way through the top and part way through the bottom. In each processing operation such as deposition or etching, the via length subject to the processing operation is reduced, effectively reducing the aspect ratio subjected to processing. Therefore, the vias' aspect ratio can be doubled without changing the etch and deposition processes. See U.S. patent application Ser. No. 13/042,186 filed Mar. 7, 2011 by the inventors of the present application.

In some embodiments, substrate 140 is silicon-on-insulator (SOI). The SOI substrate 140 includes two silicon layers on two sides of a "buried" insulator. The buried insulator acts as an etch stop during the two via etches, i.e. from the top and the bottom. The via depths are therefore uniform, even if different vias differ in shape, area, and/or fabrication methods forming the vias.

Silicon can be replaced by other semiconductor materials in the SOI substrate.

The invention is not limited to the features and advantages described above except as defined by the appended claims.

BRIEF DESCRIPTION OF THE DRAWINGS

FIGS. 2A-2J, 3A-3G show vertical cross sections of structures with through vias at different stages of fabrication according to some embodiments of the present invention.

DESCRIPTION OF SOME EMBODIMENTS

The embodiments described in this section illustrate but do not limit the invention. The invention is defined by the appended claims.

FIGS. 2A-2J illustrate vertical cross sections of an SOI substrate 140 at different stages of fabricating metalized vias 144 in some embodiments of the present invention. Substrate 140 can be used in an interposer 130 as in FIG. 1, to connect dies 110 to PCB 120. Substrate 140 can also be used to interconnect other structures attached to the top and bottom of the substrate, e.g. dies attached to the top to dies attached to the bottom. The structures attached to the top and bottom of substrate 140 may include other interposers. In other embodiments, substrate 140 is not an interposer but an integrated circuit not directly attached to any other integrated circuit. Vias 144 are used to interconnect circuit elements at the top and bottom of such integrated circuit, or to connect such elements to PCB 120 or to other dies or interposers. Other uses of vias 144 may be possible.

Figure 2A:
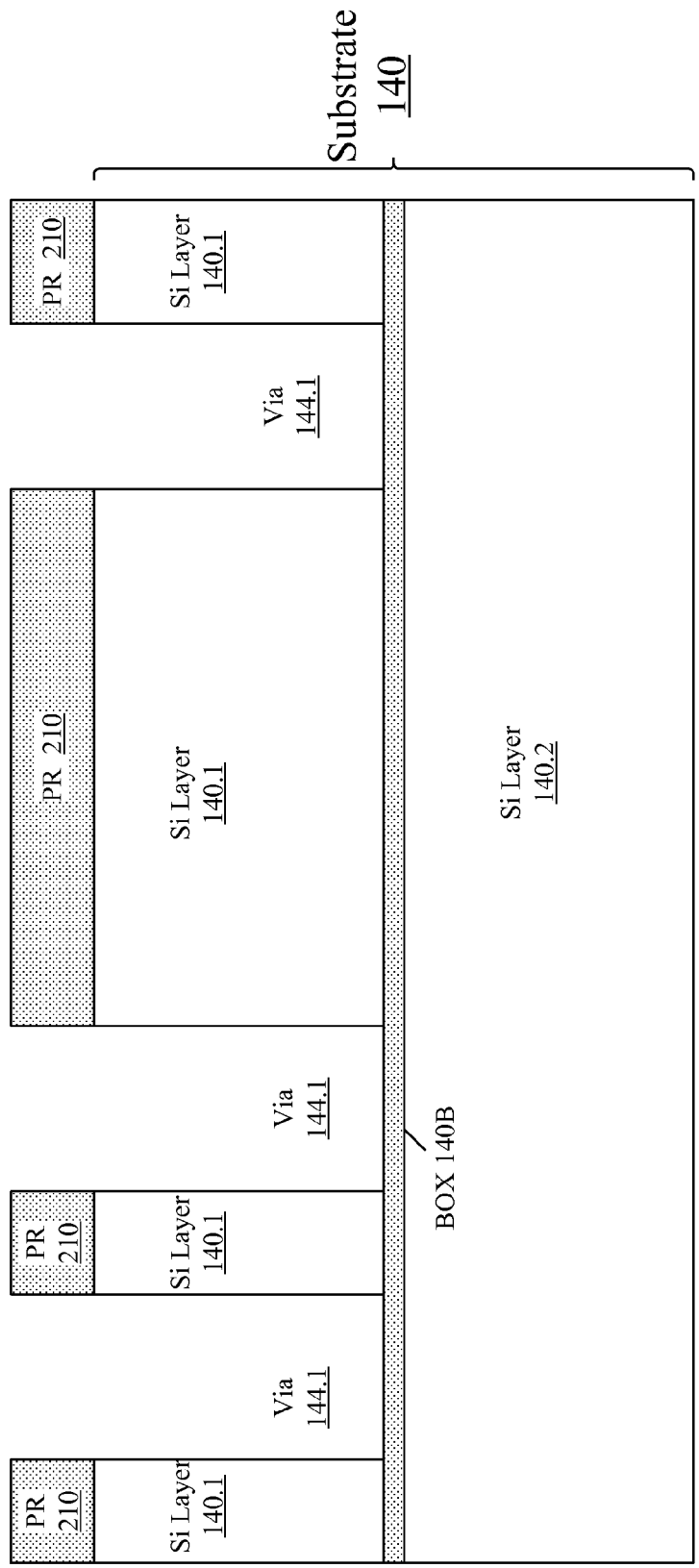

As shown in FIG. 2A, substrate 140 consists of semiconductor layers 140.1, 140.2 separated by buried insulating layer 140B. For the sake of illustration, the example being described assumes that layers 140.1 and 140.2 are monocrystalline silicon, and buried insulator 140B is silicon dioxide ("buried oxide" or "BOX"). Other embodiments use other semiconductor materials for layer 140.1 and/or 140.2 (e.g. gallium-arsenide, etc.) and other insulating materials for layer 140B (e.g. glass). The invention is not limited to particular materials unless indicated to the contrary. Substrate 140 will be called a "wafer". The wafer may have any shape (circular, rectangular, etc.).

Buried insulating layer 140B has planar top and bottom surfaces contacting, at all points, the adjacent planar surfaces of layers 140.1, 140.2. In other embodiments, various features have been formed in layer 140.1 and/or layer 140.2 to expose parts of insulator 140B.

Layers 140.1 and/or 140.2 have been thinned to their final thickness (e.g. 200 μm in some embodiments; the dimensions are not limiting unless stated to the contrary). In this embodiment, layers 140.1, 140.2 have the same final thickness to reduce the maximum depth of the to-be-formed vias 144. However, having the same final thickness is not necessary.

BOX 140B can be 1 μm thick, and other thickness values are possible.

A photoresist layer 210 is formed on layer 140.1. Resist 210 is patterned to define the vias 144. Then vias are etched through layer 140.1, and are shown as 144.1. The etch is selective to, and stops on, BOX 140B. Each via 144.1 will provide one segment of a via 144. There can be any number of vias 144. Some embodiments have thousands of such vias. Other embodiments have a single via.

In the embodiment being described, vias 144.1 are formed by deep reactive ion etching (DRIE), and are shaped as circular cylinders with a vertical sidewall of 65 μm diameter. Other processes (e.g. wet etch, or laser drilling, with or without photoresist), and non-circular or non-cylindrical shapes, with vertical or sloped sidewalls, can also be provided. The invention is not limited to the shapes and processes mentioned unless stated to the contrary. Different vias 144.1 may have different shapes and areas, and may or may not have vertical sidewalls. Different vias 144.1 may have differently sloped sidewalls in the same structure, and may be formed by different processes. For example, some vias 144.1 may be formed by DRIE, and others by a wet etch. In the same via, the sidewall may have different slopes on different sides and/or at different depths on the same side. In some embodiments, some of the vias will not be extended to through vias in the final structure.

Precise control of the via depth is easily achieved if the via etches are selective to layer 140B. Precise control may or may not be important depending on the particular application, and may be especially important if there are thousands of vias 144 scattered over the wafer. In some SOI embodiments, with layer 140.1 being silicon and with insulator 140B being silicon dioxide, the silicon etch is performed by DRIE using the Bosch process (time-multiplexed etching). The process involves repeated etching steps ($SF_6$ plasma etch of silicon) alternating with passivation steps to form passivation in the vias. Some embodiments use the etcher of type STS ASE HRM Multiplex from Surface Technology Systems (now SPP Process Technology Systems) having an office in the United Kingdom. In some of these embodiments, each etching step lasts 5 seconds, with the $SF_6$ flow rate of 200 ccm (cubic centimeters per minute), the coil power of 1700 W, the platen power of 20 W, and the pressure of 30 mTorr. Each passivation step lasts 2 seconds, the $C_4F_8$ flow rate is 80 ccm, the coil power is 1400 W, the platen power is zero, and the pressure is 15 mTorr. The etch selectivity to silicon dioxide 140B is about 150:1. The resulting vias' sidewalls are generally vertical, but are locally uneven (undulating) as common for the Bosch process.

Photoresist 210 is stripped (see FIG. 2B-1), and photoresist 214 is formed on the "second" side of wafer 140 (the side of layer 140.2). The wafer can be turned upside down for this purpose, i.e. with the second side being on top. The wafer orientation in the drawings does not always represent the actual orientation. Resist 214 is patterned to define vias 144.2 through layer 140.1. In the embodiment shown, vias 144.2 are a mirror image of vias 144.1. Therefore, the optical mask (not shown) used to pattern the resist 214 can be a mirror image of the optical mask (not shown) used to pattern the resist 210 (FIG. 2A). Vias 144.2 can be formed by the same type of etch as vias 144.1 or by a different type of etch. Vias 144.2 may or may not have the same respective shapes and sidewall slopes as the respective vias 144.1. The etch stops on buried insulator 140B.

Any shapes, dimensions, and sidewall angles are possible for different vias in the same substrate, as illustrated in the example of FIG. 2B-2. Substrate 140 is at the same stage of fabrication as in FIG. 2B-1, except that the resist 214 has been removed. Vias 144.1 are shown as 144.1A through 144.1C. Vias 144.2 are shown as 144.2A, 144.2B, and 144.2D. Vias 144.1A, 144.2A may or may not be later joined to form a through via (after the etch of buried oxide 140B described below). Vias 144.1A, 144.2A are not perfectly aligned. Vias 144.1B, 144.2B may provide another through via. Vias 144.1B, 144.2B are also slightly misaligned, and via 144.2B has a sloped sidewall while via 144.1B has a vertical sidewall. Vias 144.1C, 144.2D will not be part of through vias. In some embodiments, via 144.1C is a trench whose sloped sidewall will provide a mirror for a MEMS device. Via 144.1C was formed by a different type of etch (not by a perfectly anisotropic etch) than the vias 144.1A and 144.1B. Vias 144.1A and 144.1B may also be formed by different types of etches. Other variations are possible in vias' shapes, dimensions and fabrication processes.

In the examples of FIGS. 2A, 2B-1, 2B-2, substrate 140 was thinned to its final thickness before the stage of FIG. 2A. In other embodiments, one or both of silicon layers 140.1, 140.2 can be thinned to their final thickness at a later stage. For example, layer 140.1 can be thinned before the stage of FIG. 2A, and layer 140.2 can be thinned after formation of vias 144.1 before or after formation of vias 144.2. It may be desirable to thin each of layers 144.1, 144.2 to its final thickness before the vias are etched through the layer, in order to reduce the etch depth. However, layer 144.1 and/or 144.2 can also be thinned after the via etch through the layer.

The subsequent fabrication steps will now be described on the example of the vias of FIG. 2B-1. As for FIG. 2B-2, the through-via fabrication process is similar. In either case, the through-via fabrication steps can be combined with fabrication of other vias and other features in the same structure.

As shown in FIG. 2C, insulator 218 is formed on the exposed silicon surfaces (and possibly non-silicon surfaces) of substrate 140. In particular, insulator 218 covers the sidewalls of vias 144.1, 144.2. In some embodiments, insulator 218 is silicon dioxide formed by thermal oxidation of silicon to an exemplary thickness of 0.5 μm. Other insulating materials, thickness values, and fabrication methods can also be used. Thermal oxidation provides good-quality silicon dioxide, but the associated high temperature (about 1000° C.) may be undesirable if temperature-sensitive elements (not shown) have been formed in or above or below substrate 140. Such elements may include transistor source/drain regions or other doped regions, metal features, and possibly other elements. Fabrication steps for such elements can be interspersed with through-via fabrication steps being described.

Then metal is deposited into vias 144.1. For example (FIG. 2D), a barrier layer 226 (e.g. 250 nm thick titanium-tungsten) is deposited (e.g. by physical vapor deposition (PVD), possibly sputtering) on the "first" side of wafer 140, i.e. the side of layer 140.1. A seed layer 230 is deposited on barrier layer 226 for electrodeposition. For example, the seed layer can be copper deposited to a 1 μm thickness by PVD, e.g. sputtering. (If desired, the seed layer thickness can be increased by electrodeposition of additional copper.)

Higher quality (and in particular high thickness uniformity) of barrier and seed layers 226, 230 is achievable because vias 144.1 are only half as deep as the thickness of substrate 140.

An electroplating mask 240 is then formed by depositing photoresist (e.g. dry film resist or some other type) over the first side of substrate 140 and photolithographically patterning the resist to expose the vias 144.1 and, possibly, areas immediately adjacent to the vias. In some embodiments, the exposed areas are 85 μm in diameter around each via 144.1 into which the metal is to be electroplated, and each such via 144.1 is at the center of the exposed area. In addition, mask 240 exposes seed layer 230 at the edges (not shown) of substrate 140 for connection to the cathode of a power supply (not shown) in the subsequent electroplating step. Other areas (not shown) may also be exposed if electroplating is to be performed on those areas. If electroplating is not to be performed into one or more of the vias 144.1 or in any other areas, such vias and areas are left covered by mask 240.

Metal 244 (FIG. 2E), such as copper, is electroplated on the exposed surfaces of seed layer 230 and, possibly, some adjacent areas. The copper fills the vias 144.1, and may protrude above the photoresist 240.

Figure 1:
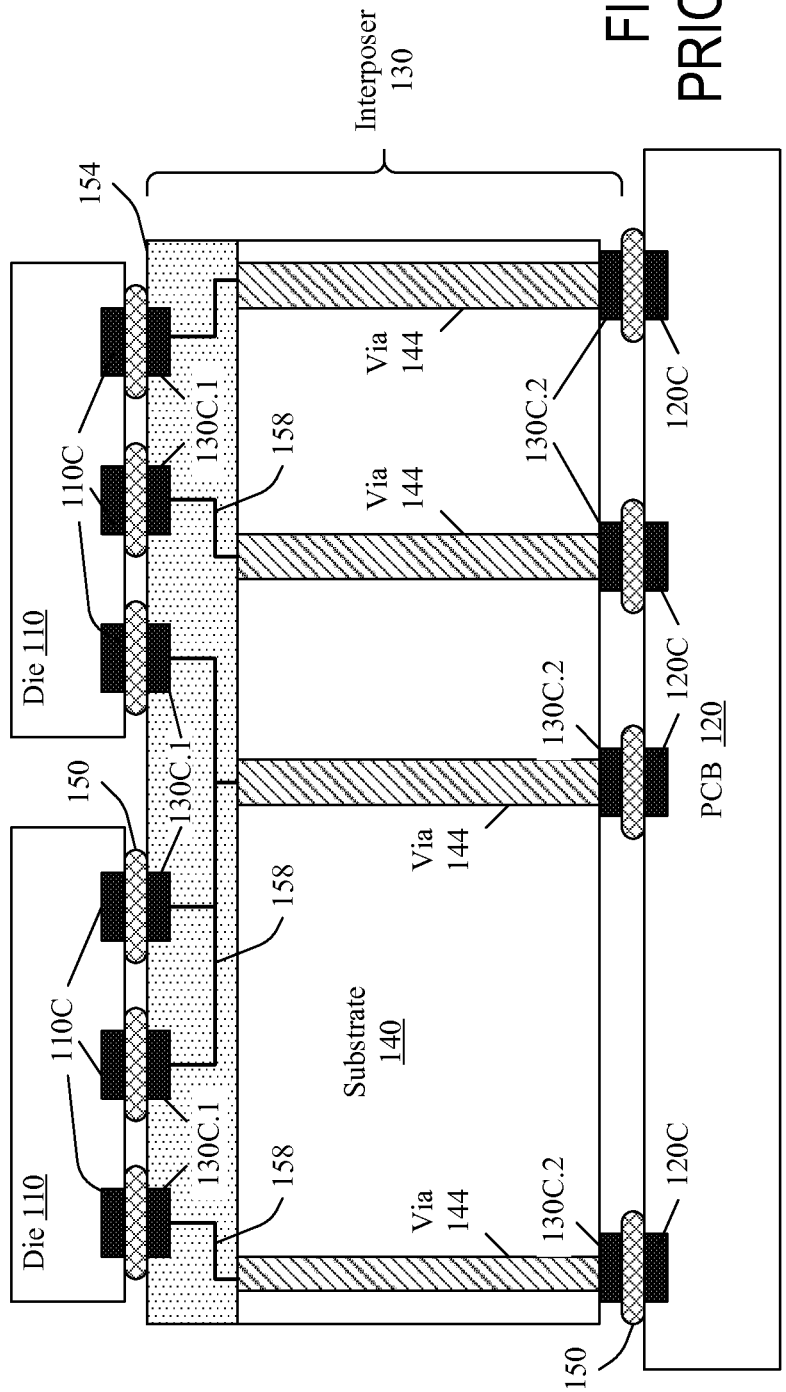
FIG. 1 shows a vertical cross section of a semiconductor integrated package according to prior art.
Figure 2D:
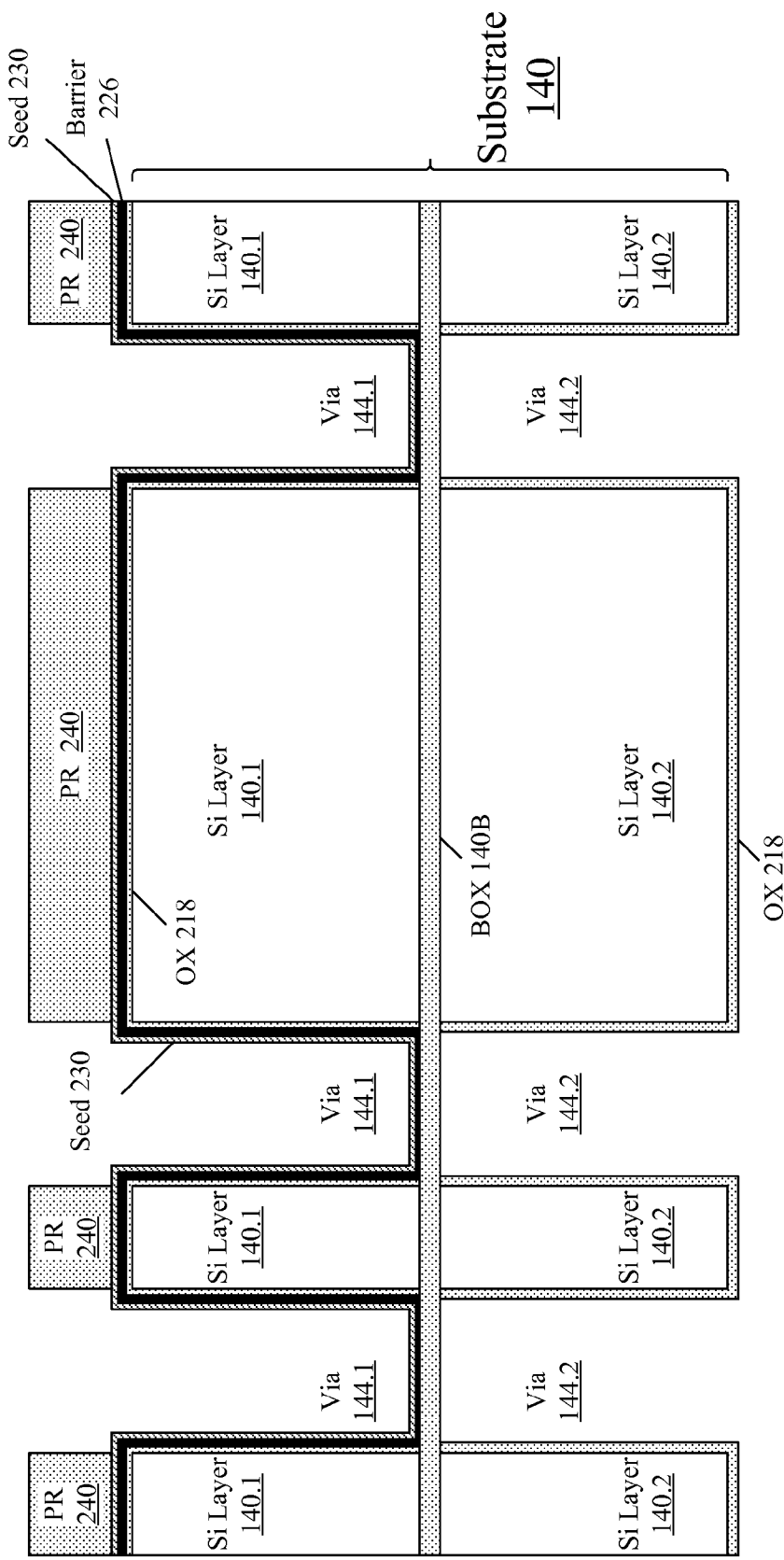
Figure 2E:
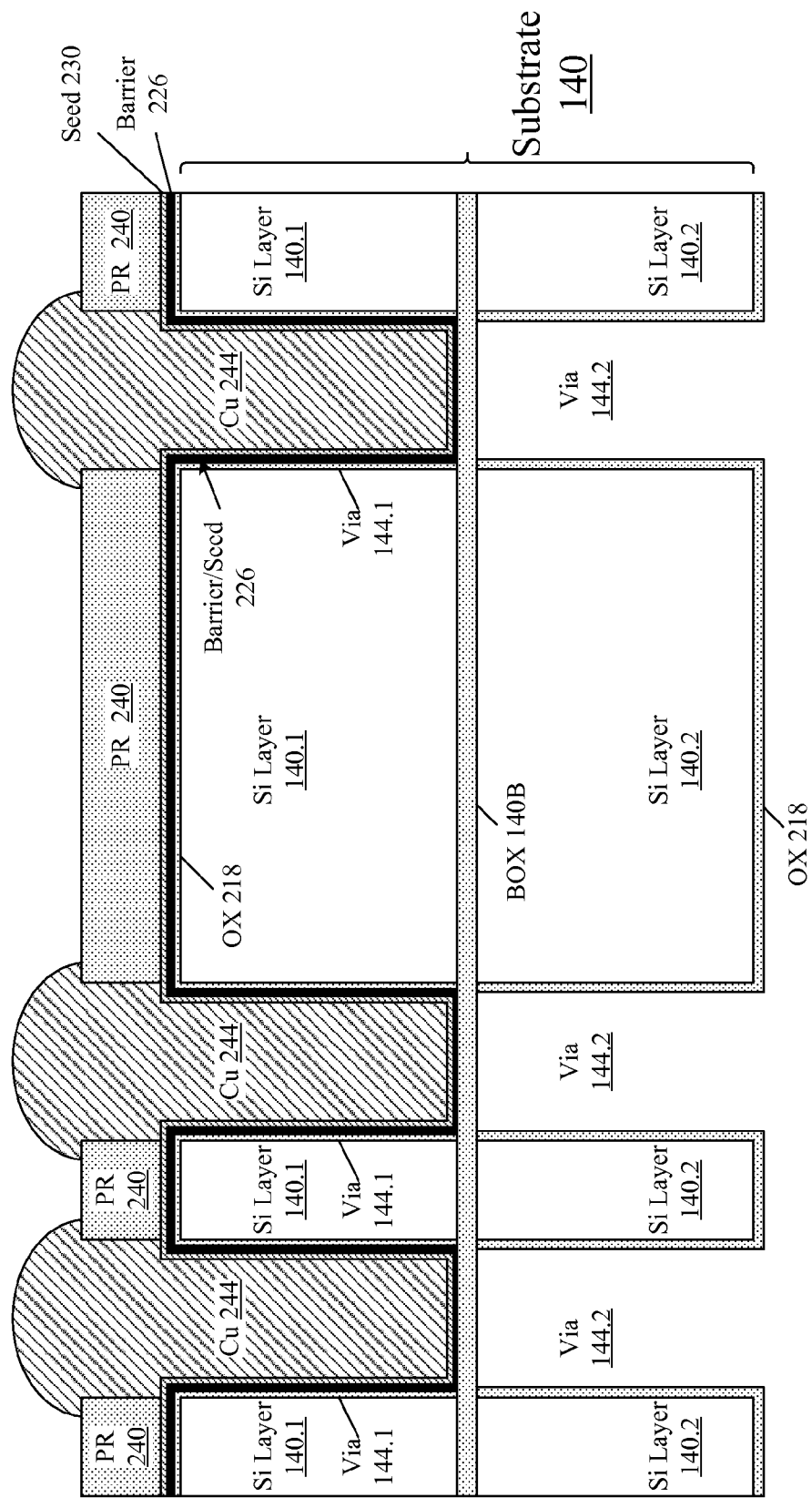
Figure 2F:
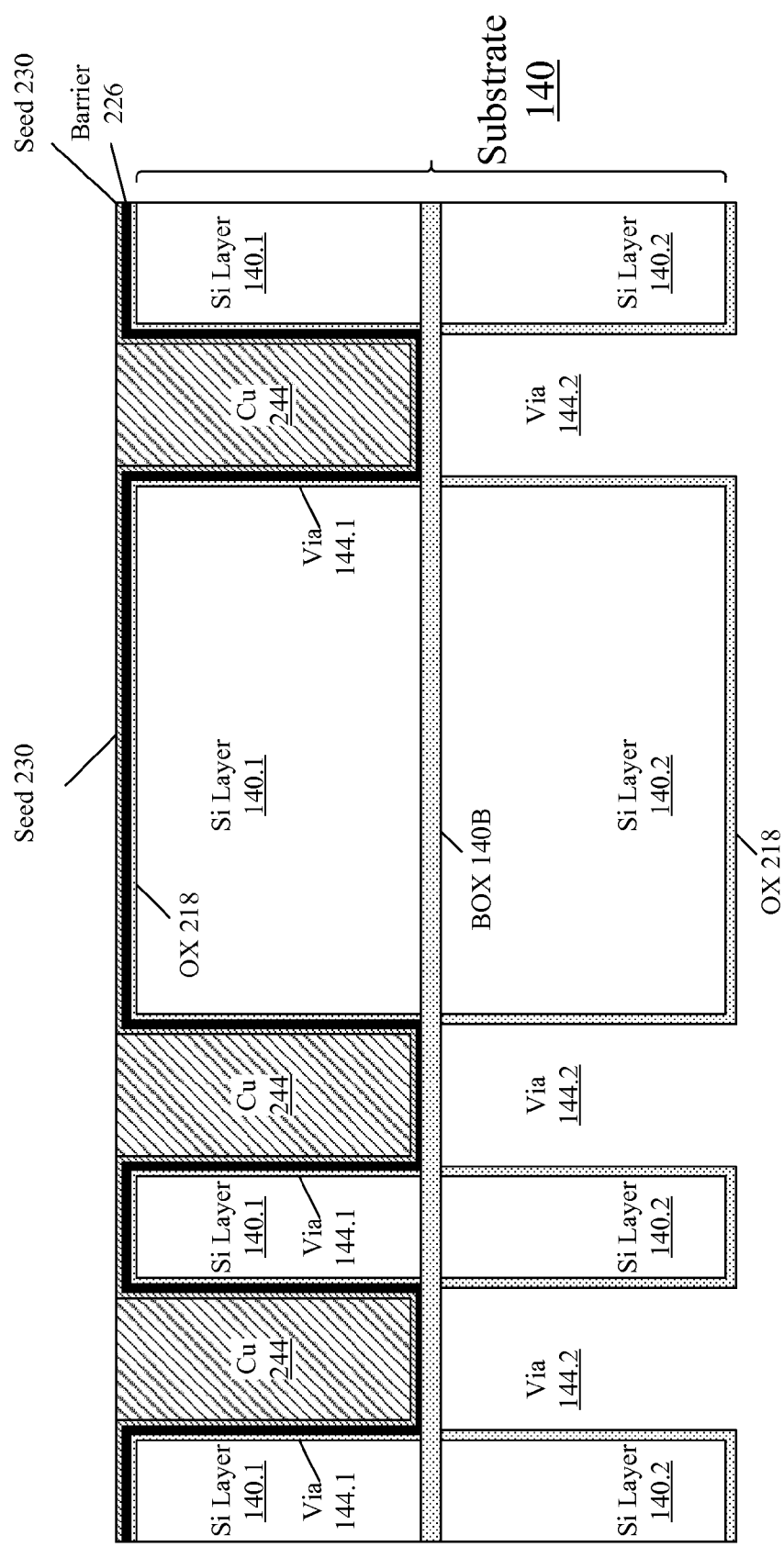

As shown in FIG. 2F, the first side of wafer 140 is planarized to expose the seed layer 230 or, in alternate embodiments, to expose the insulator 218. More particularly, in some embodiments, the wafer is first polished by CMP (chemical mechanical polishing) that stops on resist 240. Then the resist is stripped, so that copper 244 forms upward protrusions at the top. Then another CMP process polishes away the upward protrusions (bumps) of copper 244 to obtain a planar surface as shown in FIG. 2F. Seed layer 230 remains intact at the top, but in some embodiments the seed layer is removed outside of vias 144.1. Alternative processing, which also provides a planar top surface but removes the barrier/seed layer from the wafer top to expose the insulator 218 outside of vias 144.1, can be performed as described, for example, in the aforementioned U.S. patent application Ser. No. 13/042,186 filed by the inventors of the present application on Mar. 7, 2011 and incorporated herein by reference. The alternative processing begins like the processing described above, i.e. copper 244 is polished by CMP, and then resist 240 is removed leaving upward protrusions of copper 244. Then the exposed portions of barrier 226 and seed 230 are etched away (by dry and/or wet etching steps) outside of vias 144.1. Then an insulating layer (e.g. polyimide) is formed over the wafer. For example, the polyimide can later insulate the silicon 140 from solder (not shown) when the wafer 140 is soldered to PCB 120 (FIG. 1). After the polyimide deposition, a CMP process is applied to polish copper 244 and the polyimide down to the level of the planar polyimide portions surrounding the vias 144.1.

Other processing is also possible, and a planar top surface is not required in some embodiments.

Figure 2G:
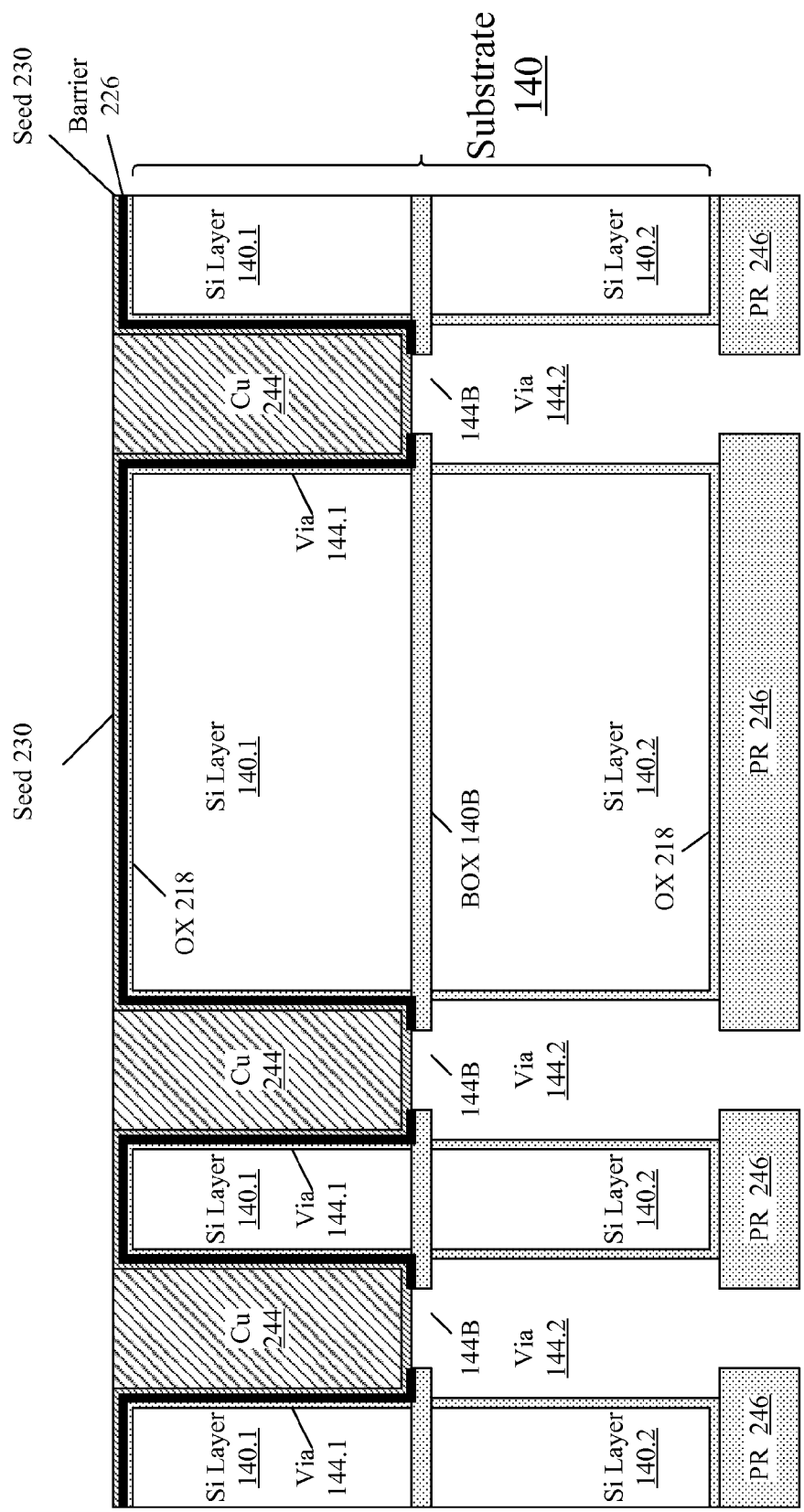
Figure 2H:
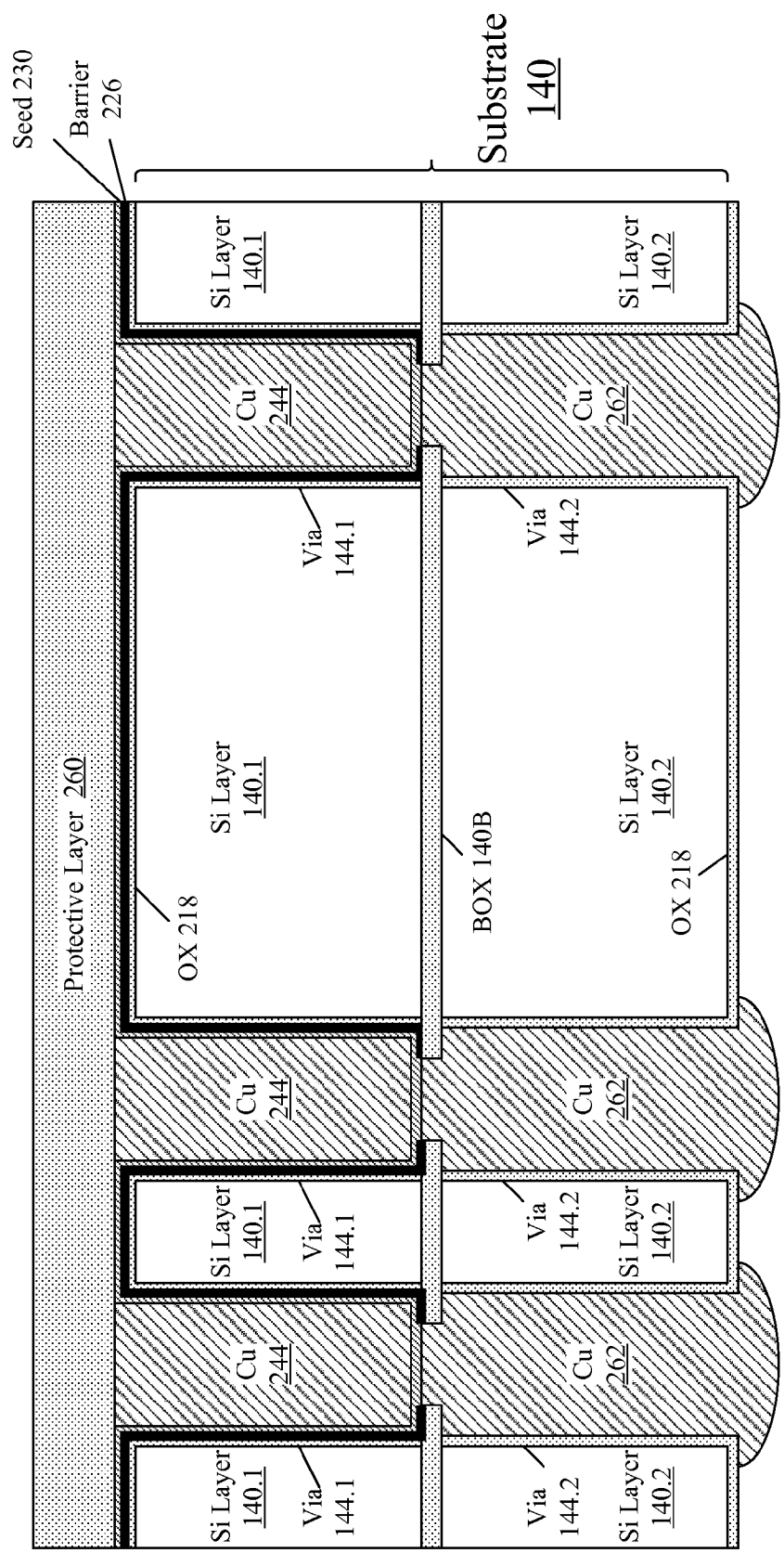

Then (see FIG. 2G showing the next processing stage for the case of FIG. 2F) holes 144B are formed in buried insulator 140B to connect vias 144.1 to respective vias 144.2 and thus form through vias 144 through substrate 140. More particularly, an etch mask 246 is formed on the wafer's second side. In some embodiments, etch mask 246 is dry film resist patterned to overhang the edges of each via 144.2 in which a hole 144B will be made. The insulator 140B is then etched, e.g. by a dry vertical etch, to form the holes 144B. The etch exposes barrier layer 226. Then barrier layer 226 is etched, with resist 246 and/or oxide 140B as a mask, to expose copper seed 230. (Resist 246 may be removed before the etch of barrier 226.) An exemplary etch process etches both insulator 140B (silicon dioxide) and barrier layer 226 (titanium-tungsten) by $CF_4$ in an etcher of type MULTIMODE® HF-8 available from AXIS, Inc. having an office in California. In this example, the platen power is set to 500 W; the etch time is 40 minutes.

Then resist 246 is stripped (even it was not stripped before the etch of barrier 226). A protective layer 260 (FIG. 2H) is formed over the wafer's first side for protection in the subsequent electrodeposition of copper 262 into vias 144.2. In some embodiments, layer 260 is dry film resist, but other materials can also be used. Layer 260 covers the whole wafer except for one or more areas (not shown) at the wafer periphery, to expose the seed layer 230 for connection to the cathode of a power supply (not shown) for the electrodeposition of copper 262.

The electrodeposition is performed next. Copper 262 is electroplated onto the exposed portions of seed layer 230 in holes 144B (marked in FIG. 2G). Copper 262 fills vias 144.2 and, possibly, extends to adjacent areas over the wafer's second side. Vias 144 become completely filled with copper, the barrier layer, and insulator 218.

Figure 2I:
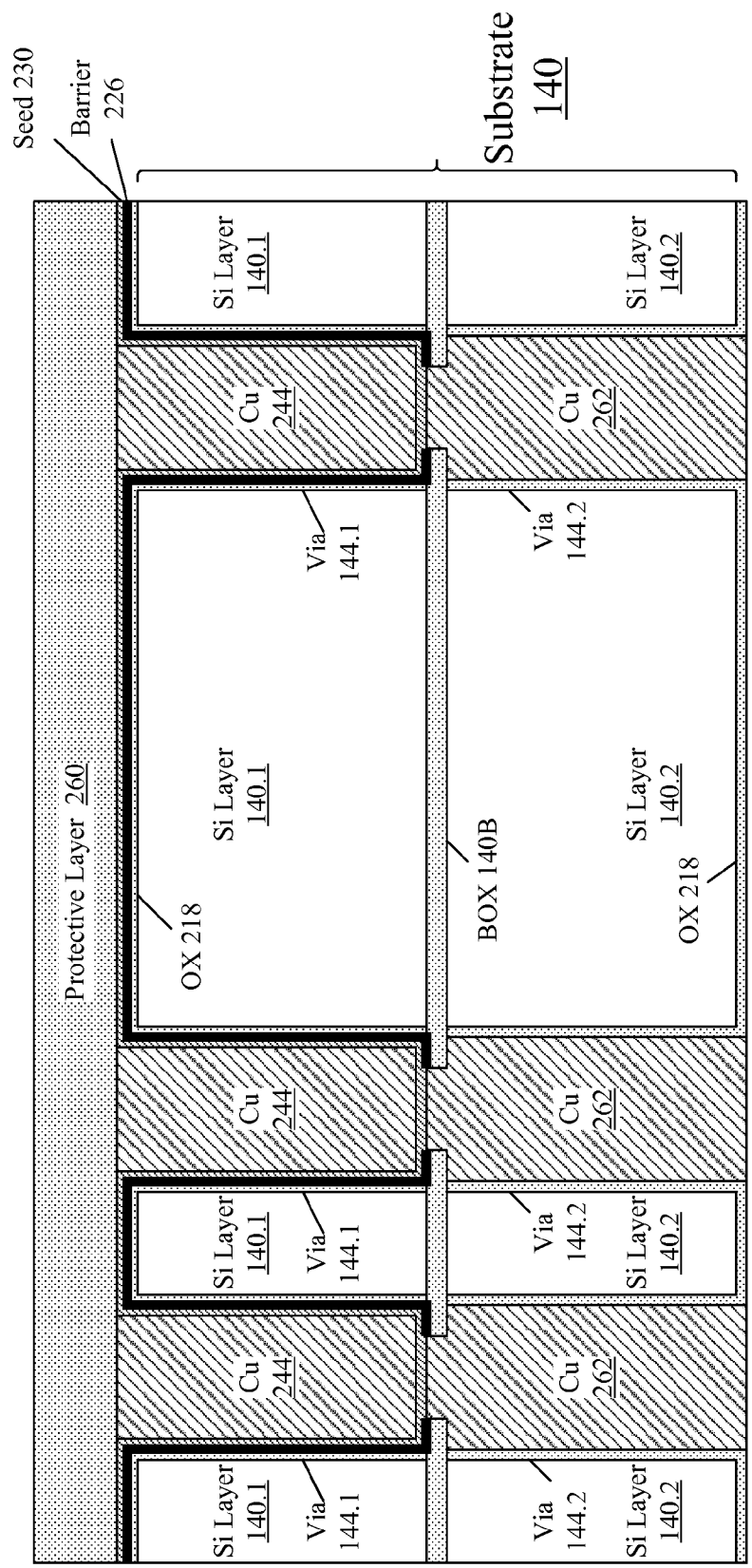

Protruding portions of copper 262 are removed on the second side, e.g. by CMP stopping on insulator 218, as shown in FIG. 2I.

In this embodiment, the sidewalls of vias 144.2 are not protected by a barrier layer. In other embodiments, a barrier layer (not shown, e.g. titanium tungsten) can be formed on the wafer's second side at a suitable stage, e.g. at the stage of FIG. 2F, before forming the resist mask 246 (FIG. 2G). In some such embodiments, when the mask 246 has been formed, the barrier layer is etched in vias 144.2 to expose insulator 140B, and then insulator 140B and barrier 226 are etched to expose the seed 230. Alternatively, after the barrier layer deposition on the second side, a seed layer can be formed on the second side on the barrier layer. Then mask 246 can be formed, and the seed layer, the barrier layer, and insulator 140B are etched to form openings 144B. The barrier layer 226 in vias 144.1 may or may not be etched since the seed 230 does not have to be exposed in view of the seed layer on the second side.

In another alternative processing of the second side, the barrier layer, with or without the seed layer, can be formed on the second side after the etch of openings 144B when the mask 246 has been removed.

Figure 2J:
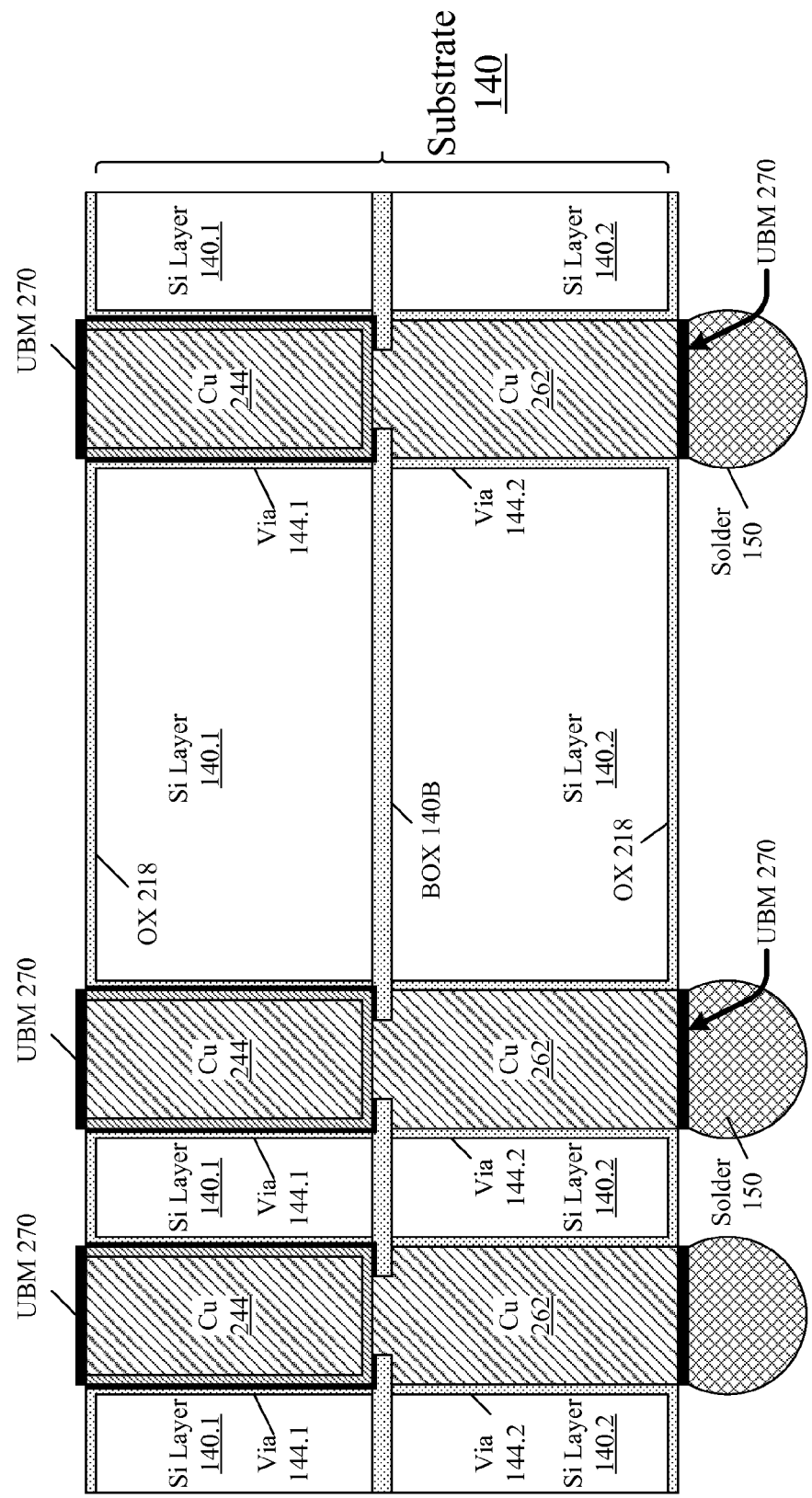

In all such embodiments (with or without the barrier and seed layers on the second side), the processing after electrodeposition of copper 262 depends on the desired use of substrate 140. In the example of FIG. 2J, protective layer 260 is removed, and the first side is polished by CMP to the level of insulator 218. Then UBM (under ball metallization) 270 is formed on copper 244, 262 by known techniques. Solder balls 150 are shown on the second side UBM features, but can also be formed on the first side UBM. The solder can be used to connect the metalized through vias 144 to other structures (e.g. dies' or wafers' contact pads, bond wires, etc.).

Alternatively, an interposer 130 can be constructed as in FIG. 1. Rerouting layers 154 can be formed on the first and/or second side by depositing and patterning insulating and conductive layers. The conductive layers will provide lines 158 and contact pads 130C.1, 130C.2. These contact pads can be attached to contact pads 110C, 120C by solder, or conductive adhesive, or other means (e.g. bond wires).

Interposer 130 can be connected to other interposers and/or dies on both sides (top and bottom). Substrate 140 can be diced into dies. Other passive and active circuit elements can be formed in the interposer.

Figure 3E:
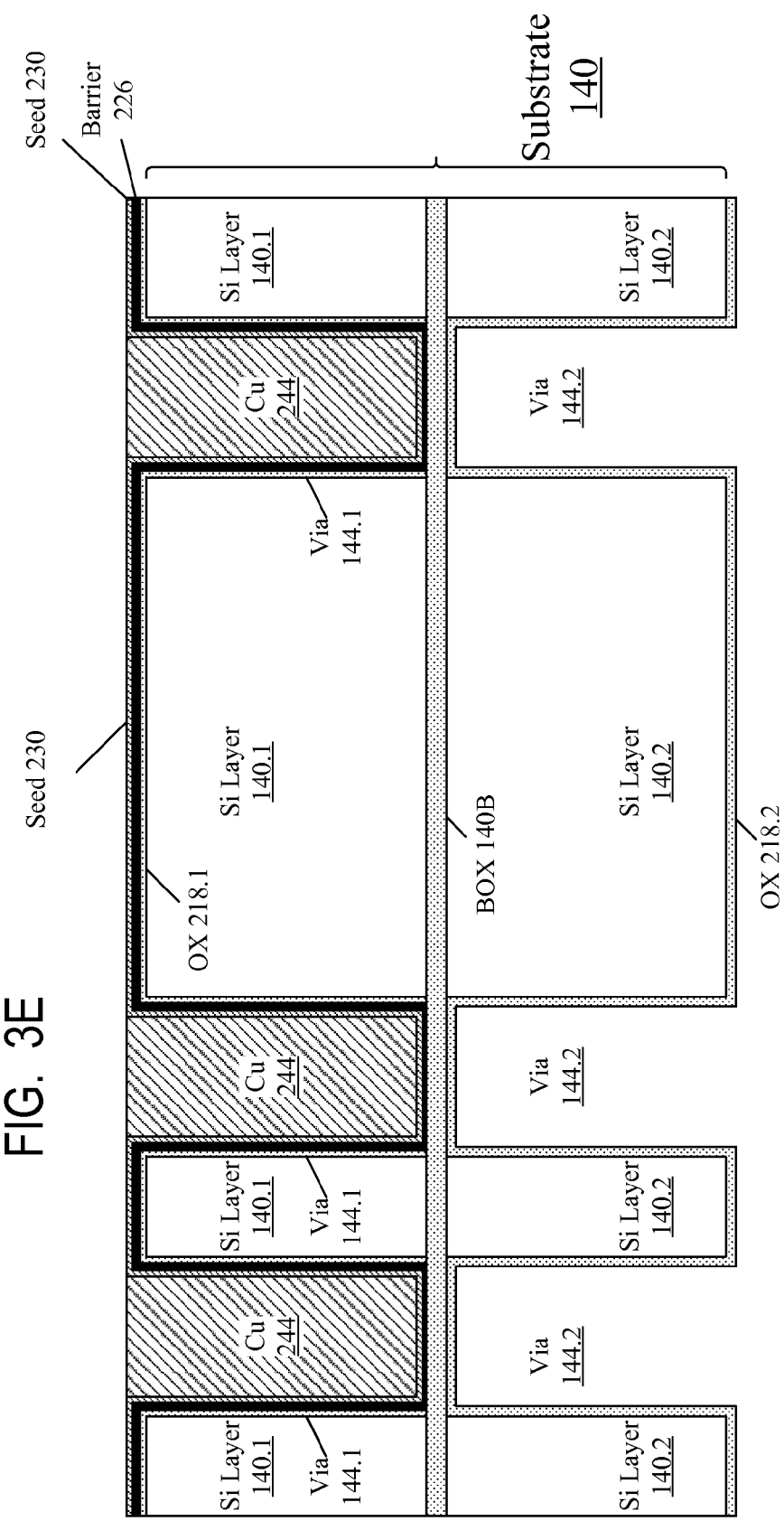

Another fabrication process is illustrated starting with FIG. 3A. This and subsequent figures show vertical cross sections at different stages of fabrication. The fabrication starts with the same type of substrate 140 (e.g. an SOI substrate) as in FIG. 2A. This description will assume an SOI with silicon dioxide layer 140B, but other materials can be used as in the processes of FIGS. 2A-2J.

Silicon layer 140.1 is thinned to its final thickness. Layer 140.2 is not thinned at this stage. Therefore, the wafer is mechanically stronger, more rigid, and has higher heat-dissipation capability.

Then vias 144.1 are formed in layer 140.1 as in FIG. 2A. (The description immediately below will assume that the vias 144 will have the same geometry as in FIG. 2B-1, but the geometry of FIG. 2B-2 is also possible.)

Next, insulator 218.1 (FIG. 3A) is formed on the exposed semiconductor surfaces of layer 144.1, and possibly other surfaces. The same processes can be used as for insulator 218 of FIG. 2C. In some silicon embodiments, the insulator is silicon dioxide formed by thermal oxidation or CVD (chemical vapor deposition). If thermal oxidation is used, oxide 218.1 can also form on layer 140.2 as shown in FIG. 3A.

Then (FIG. 3B) the first side of the structure is processed as in FIGS. 2D-2F. More particularly, barrier 226 and seed 230 are deposited, then electroplating mask 240 (FIG. 2D) is formed, then metal 244 is electroplated (FIG. 2E), and then mask 240 and excess metal are removed to obtain a planar surface on the first side. The same materials and processes can be used as in FIGS. 2D-2F, and with the same variations (e.g. the top surface does not have to be planar, oxide 218.1 can be exposed on top, etc.).

Next (FIG. 3C), the wafer's second side is thinned, by mechanical grinding or another process. Insulator 218.1 becomes removed from the second side, and layer 140.2 is thinned to its final thickness.

Then (FIG. 3D) mask 214 (e.g. photoresist) is formed on the wafer's second side, and vias 144.2 are etched, as described above in connection with FIG. 2B-1 or 2B-2.

Then (FIG. 3E) resist 214 is removed, and insulator 218.2 is formed on the semiconductor and possibly non-semiconductor surfaces on the second side of the wafer. If needed to avoid high-temperature damage to the first side elements (e.g. copper 244), then insulator 218.2 can be formed by a low-temperature process, e.g. by TEOS or some other type of CVD for silicon dioxide, or by ALD (atomic layer deposition) of aluminum oxide.

The subsequent processing is similar to that of FIGS. 2G-2J, and the same variations can be used as described for those figures. For example (FIG. 3F), holes 144B are formed at the bottom of vias 144.2 by a masked etch using a mask 246 or by some other process essentially as described above in connection with FIG. 2G. In the embodiment of FIG. 3F, insulator 218.2 covers the bottoms of vias 144.2, and holes 144B pass through insulator 218.2 and BOX 140B to expose barrier 226, and possibly seed 230, and possibly copper 244.

Figure 3G:
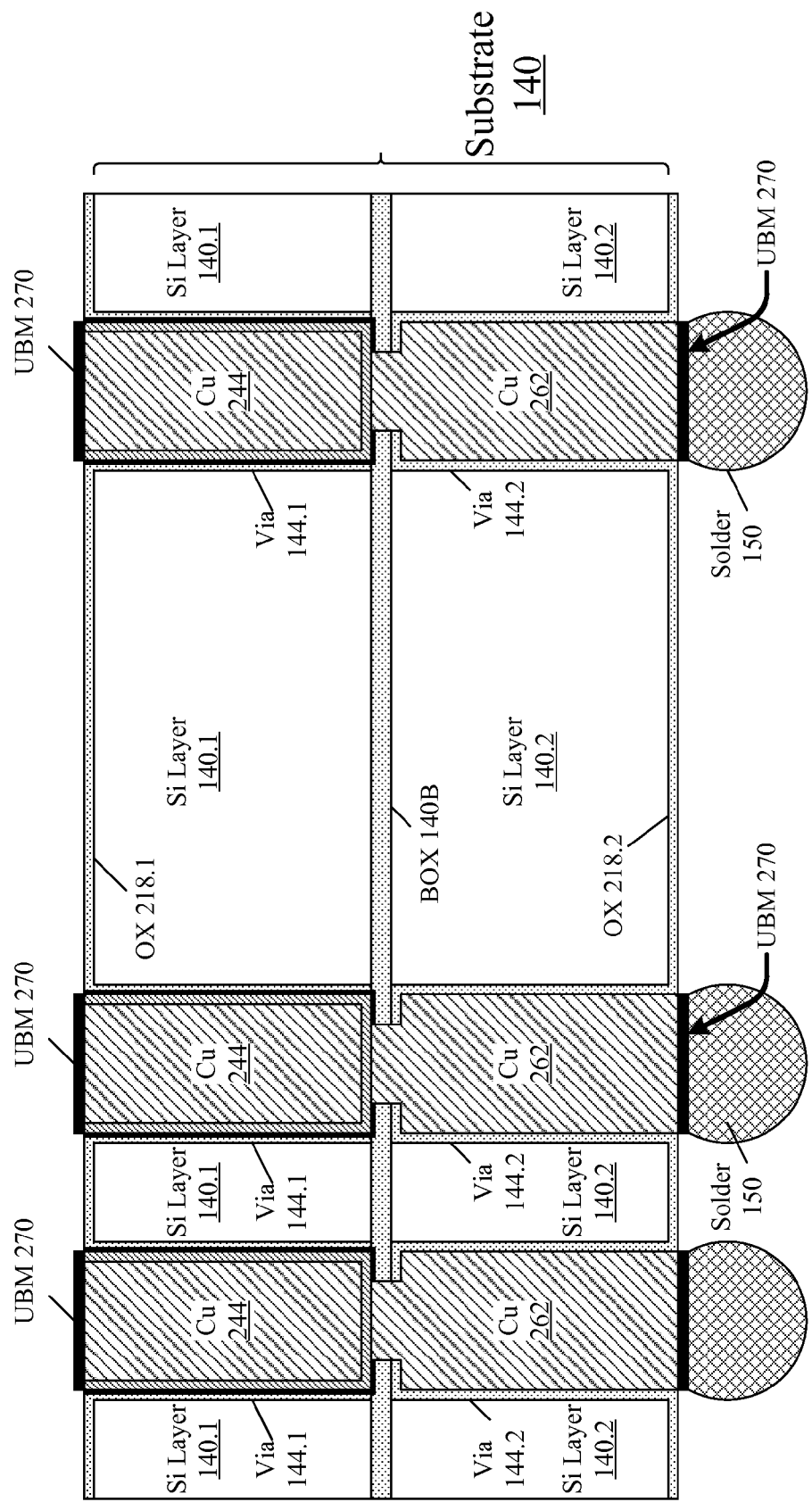

The remaining processing can be as described above in connection with FIGS. 2H-2J. FIG. 3G shows an exemplary structure at the processing stage of FIG. 2J. Many variations are possible as described above for FIGS. 2H-2J. Still further processing can be as described above, to form interposers or other types of devices.

Many other variations are possible for the processes and structures described above. For example, in some embodiments, metal 244, 262 does not fill the center portions of vias 144.1 and/or 144.2 but rather forms a thin film on the via sidewalls. Whether or not the metal fills the vias, the same metal layers can be deposited outside of vias (by suitably patterning the mask layer 240 of FIG. 2D and mask layer 246 of FIG. 2G for example) for use as interconnects, capacitor plates, or any other suitable use. The process steps illustrated in FIGS. 2A-2J and 3A-3G can be interspersed with other steps that form circuit elements and other features in or on substrate 140.

The invention is not limited to the embodiments described above. Some embodiments provide a structure comprising:

a planar insulating layer (e.g. buried insulating layer 140B);

a first semiconductor layer (e.g. 140.1) overlying the planar insulating layer, the first semiconductor layer having a planar bottom surface contacting a top surface of the planar insulating layer;

a second semiconductor layer (e.g. 140.2) underlying the planar insulating layer, the second semiconductor layer having a planar top surface contacting a bottom surface of the planar insulating layer;

one or more through vias each of which passes through the planar insulating layer and the first and second semiconductor layers, wherein in at least one through via the planar insulating layer protrudes into the through via out of the first and second semiconductor layers. For example, in each of FIGS. 2J and 3G, in each through via 144 (formed by the joining of a respective via 144.1 with a respective 144.2), buried insulating layer 140B protrudes into the through via out of semiconductor layers 140.1 and 140.2.

Figure 4:
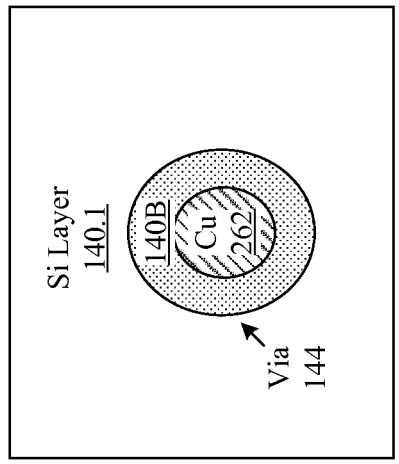

In some embodiments, in at least one trough via, the planar insulating layer protrudes into the through via out of the first and second semiconductor layers at each lateral position of the through via's sidewall. For example, FIG. 4 shows the top view of the structure of FIG. 2J or 3G around one circular through via 144, with all the features removed except silicon layer 140.1, buried insulator 140B, and copper 262. Buried insulator 140B is blocked from view by silicon layer 140.1 except in through via 144. In the through via, buried insulator 140B protrudes into the through via out of silicon layer 140.1 at each lateral position of the through via's sidewall, i.e. all around along the lateral boundary of the through via. Likewise, buried insulator 140B protrudes out of silicon layer 140.2 (not shown in FIG. 4) at each lateral position of the through via's sidewall.

Figure 5:
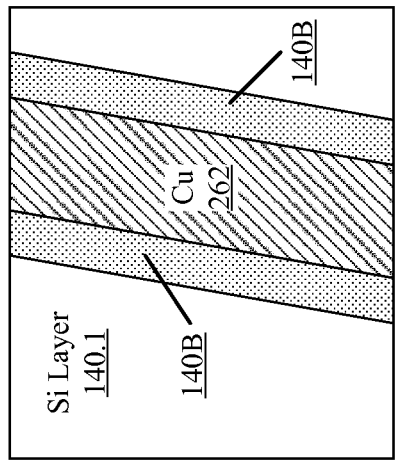
FIGS. 4, 5 show top views of structures with through vias according to some embodiments of the present invention.

FIG. 5 shows a similar view for the case when the through via is a trench passing through the entire substrate 140. Buried insulator 140B protrudes into the through via on both sides of the trench, i.e. at each lateral position of the through via's sidewall (the sidewall does not surround the through via on all lateral sides, but the buried insulator 140B protrudes wherever the sidewall is present).

In some embodiments, each of the one or more through vias comprises a conductor which provides a conductive path between the first and second semiconductor layers. For example, in FIG. 2J, the conductor may be interpreted as copper 244, 262. Alternatively, the conductor can be interpreted as including seed 230 and/or barrier 226. Non-copper and non-metal conductive materials can also be used.

In some embodiments, at least one of the one or more through vias is filled with the respective conductor or with a combination of the respective conductor (e.g. 244, 262, 230, 226 in FIG. 2J) and an insulator (such as 218 in FIG. 2J) provided between the conductor and the first semiconductor layer and/or between the conductor and the second semiconductor layer. An insulator can be omitted. Of note, semiconductor layers 140.1, 140.2 can be insulating layers (e.g. gallium arsenide).

In some embodiments, the first and second semiconductor layers have the same thickness adjacent each through via. (A thickness of 200 μm was noted above, but this is not limiting.) However, the first and second semiconductor layers may also differ in thickness. For example, if Th1 denotes the thickness of the first semiconductor layer at the side of a through via, and Th2 denotes the thickness of the second semiconductor layer at the same through via, then in some embodiments, $$1/k*Th2 \leq Th1 \leq k*Th2$$

where k is a suitable value, e.g. 1.5, 2, 3, 10, or any other suitable value. Of note, each of Th1 and Th2 may have different values at different vias in the same structure.

Some embodiments provide a manufacturing method comprising:

(1) obtaining a structure comprising:
a planar insulating layer (e.g. 140B) having a first planar surface and a second planar surface opposite to the first planar surface;
a first semiconductor layer (e.g. 140.1 or 140.2) having a planar surface contacting the first planar surface of the planar insulating layer; and
a second semiconductor layer (e.g. 140.2 or 140.1) having a planar surface contacting the second planar surface of the planar insulating layer;

(2) removing part of the first semiconductor layer to form one or more first vias (e.g. 144.1) through the first semiconductor layer, the one or more first vias not passing through the planar insulating layer;

(3) removing part of the second semiconductor layer to form one or more second vias (e.g. 144.2) through the second semiconductor layer, the one or more second vias not passing through the planar insulating layer;

(4) forming one or more through-holes (e.g. 144B) in the planar insulating layer to join each second via with a respective first via to form a respective through via passing through the first and second semiconductor layers and the planar insulating layer; and (5) forming a conductor in each through via, the conductor providing a conductive path in the through via between the first and second semiconductor layers.

In some embodiments, each through via comprises the respective one first via (e.g. 144.1) and the respective one second via (e.g. 144.2) which are joined to form the through via;

the conductor in each through via comprises a first conductor portion (e.g. 244 and/or 226 and/or 230) present in the respective first via but not in the respective second via, and comprises a second conductor portion (e.g. 262) present in the respective second via but not in the respective first via;

operation (5) comprises:
(5A) forming each first conductor portion without entirely forming at least one second conductor portion (e.g. as in FIG. 2D or 2E or 2F);
(5B) before or after operation (5A), forming at least part of each second conductor portion.

In some embodiments, each second conductor portion is entirely formed in operation (5B), with no part of any second conductor portion being formed in operation (5A).

In some embodiments (e.g. FIGS. 2F-2H), the operation (5A) is performed before (4), and the operation (5B) is performed after (4).

In some embodiments (e.g. FIG. 3B), the operation (5A) is performed before (3).

Other embodiments and variations are within the scope of the invention, as defined by the appended claims.

The invention claimed is:

1. A manufacturing method comprising:
(1) obtaining a structure comprising:
a planar insulating layer having a first planar surface and a second planar surface opposite to the first planar surface;
a first semiconductor layer having a planar surface contacting the first planar surface of the planar insulating layer; and
a second semiconductor layer having a planar surface contacting the second planar surface of the planar insulating layer;
(2) forming one or more through vias each of which passes through the first and second semiconductor layers and the planar insulating layer; and
(3) forming a conductor in each through via, the conductor providing a conductive path in the through via between the first and second semiconductor layers;
wherein each through via comprises:
a respective first via portion passing through the first semiconductor layer and formed in operation (2) by removing part of the first semiconductor layer from a side opposite to the second semiconductor layer; and
a respective second via portion passing through the second semiconductor layer and formed in operation (2) by removing part of the second semiconductor layer from a side opposite to the first semiconductor layer;
wherein in each through via, the conductor comprises a first conductor portion present in the respective first via portion but not in the respective second via portion, and comprises a second conductor portion present in the respective second via portion but not in the respective first via portion;
wherein the method further comprises thinning the second semiconductor layer before forming any second via portion but after forming each first via portion and each first conductor portion.

2. The method of claim 1 wherein in operation (2), removing of the part of the first semiconductor layer and removing of the part of the second semiconductor layer are selective to the planar insulating layer, the planar insulating layer providing a stop for removing of the parts of the first and second semiconductor layers.

3. The method of claim 1 further comprising forming an insulator over a sidewall of each first via portion before forming a respective first conductor portion in the first via portion, and forming an insulator over a sidewall of each second via portion before forming a respective second conductor portion in the second via portion.

4. The method of claim 1 wherein the first and second semiconductor layers have the same thickness at each through via.

5. The method of claim 1 wherein for each through via, $$1/k*Th2 \leq Th1 \leq k*Th2$$

wherein Th1 is the thickness of the first semiconductor layer at the through via, Th2 is the thickness of the second semiconductor layer at the through via, and k is a value greater than 1 but less than or equal to 10.

6. The method of claim 5 wherein k is less than or equal to 5.

7. The method of claim 5 wherein k is less than or equal to 3.

8. The method of claim 1 wherein the operation (2) wherein each through via comprises a respective third via portion passing through the planar insulating layer and formed by removing part of the planar insulating layer through the respective second via portion.

9. The method of claim 8 wherein each third via portion is formed after forming each first conductor portion.

10. The method of claim 1 wherein operation (1) comprises thinning the first semiconductor layer before operation (2).

11. The method of claim 1 further comprising attaching one or more integrated circuits to the first semiconductor layer on the side opposite to the second semiconductor layer, the one or more integrated circuits being electrically connected to at least one first conductor portion.

12. The method of claim 1 further comprising attaching one or more integrated circuits to the second semiconductor layer on the side opposite to the first semiconductor layer, the one or more integrated circuits being electrically connected to at least one second conductor portion.

13. The method of claim 1 further comprising forming at least two active circuit elements on respective opposite sides of the planar insulating layer, the active circuit elements being electrically interconnected through at least one conductor.

14. The method of claim 1 further comprising forming one or more transistor regions in at least one of the first and second semiconductor layers.

* * * * *